United States Patent
Hwang et al.

(10) Patent No.: US 12,088,435 B2
(45) Date of Patent: Sep. 10, 2024

(54) TWO-STAGE FILTER

(71) Applicant: YUAN ZE UNIVERSITY, Taoyuan (TW)

(72) Inventors: Jeng-Kuang Hwang, Taoyuan (TW); Cheng-Feng Li, Yilan County (TW)

(73) Assignee: YUAN ZE UNIVERSITY, Taoyuan (TW)

( * ) Notice: Subject to any disclaimer, the term of this patent is extended or adjusted under 35 U.S.C. 154(b) by 69 days.

(21) Appl. No.: 18/181,515

(22) Filed: Mar. 9, 2023

(65) Prior Publication Data
US 2024/0187286 A1 Jun. 6, 2024

(30) Foreign Application Priority Data
Dec. 2, 2022 (TW) .................................. 111146281

(51) Int. Cl.
*H04L 25/03* (2006.01)
*H03H 17/02* (2006.01)

(52) U.S. Cl.
CPC ....... *H04L 25/03159* (2013.01); *H03H 17/02* (2013.01)

(58) Field of Classification Search
CPC .......................... H04L 25/03159; H03H 17/02
See application file for complete search history.

(56) References Cited

U.S. PATENT DOCUMENTS

| | | | | |
|---|---|---|---|---|
| 7,206,564 B2 * | 4/2007 | Yang | ................. | H03H 17/0294 |
| | | | | 455/226.1 |
| 8,502,597 B2 * | 8/2013 | Khatibi | ............. | H03H 11/1213 |
| | | | | 327/558 |
| 9,190,983 B2 | 11/2015 | Menkhoff | | |
| 11,146,216 B2 * | 10/2021 | Lin | ......... | H03F 3/217 |
| 2003/0053556 A1 * | 3/2003 | Maulik | .................... | H03C 3/40 |
| | | | | 375/296 |
| 2004/0125240 A1 * | 7/2004 | Stikvoort | ............... | H03D 3/007 |
| | | | | 348/731 |
| 2005/0273482 A1 | 12/2005 | Moore | | |
| 2008/0309827 A1 | 12/2008 | Kattner | | |
| 2010/0066442 A1 * | 3/2010 | Mu | .................... | H03H 11/1291 |
| | | | | 327/553 |
| 2016/0020745 A1 | 1/2016 | Joo et al. | | |
| 2022/0263511 A1 * | 8/2022 | Gao | ......................... | H03K 5/26 |

FOREIGN PATENT DOCUMENTS

CN  202178740 U  3/2012
WO  WO-2011110499 A1 * 9/2011  ........... G10L 19/008

* cited by examiner

*Primary Examiner* — Jean B Corrielus
(74) *Attorney, Agent, or Firm* — Li & Cai Intellectual Property Office

(57) ABSTRACT

A two-stage filter is provided. A first stage filter performs a first stage filtering operation on an initial signal to adjust a frequency of the initial signal to output a first filtered signal. A second stage filter is connected to the first stage filter. The second stage filter performs a second stage filtering operation on the first filtered signal to filter an interference component that is generated during the first stage filtering operation from the first filtered signal to output a second filtered signal.

11 Claims, 5 Drawing Sheets

TWO-STAGE FILTER

CROSS-REFERENCE TO RELATED PATENT APPLICATION

This application claims the benefit of priority to Taiwan Patent Application No. 111146281, filed on Dec. 2, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a filter, and more particularly to a two-stage filter.

BACKGROUND OF THE DISCLOSURE

In recent years, filters are widely used in applications of wireless technology such as data collection, signal processing and communication systems. In particular, the low-pass filters are important circuit components for signal processing. However, improvements to performance of the filters face several technical challenges that have yet to be adequately addressed.

SUMMARY OF THE DISCLOSURE

In response to the above-referenced technical inadequacies, the present disclosure provides a two-stage filter. The two-stage filter includes a first stage filter and a second stage filter. The first stage filter is configured to perform a first stage filtering operation on an initial signal to adjust a frequency of the initial signal to output a first filtered signal. The second stage filter is connected to the first stage filter. The second stage filter is configured to perform a second stage filtering operation on the first filtered signal to filter a mirror image interference component that is additionally generated during the first stage filtering operation from the first filtered signal to output a second filtered signal.

In certain embodiments, the first stage filter determines a frequency of the first filtered signal according to a target bandwidth.

In certain embodiments, the first stage filtering operation that is performed on the initial signal by the first stage filter is a low-pass filtering operation. In the low-pass filtering operation, the first stage filter reduces an upper limit frequency of the initial signal to a target frequency such that an initial bandwidth of a waveform of the initial signal is reduced to a target bandwidth.

In certain embodiments, a frequency of the first filtered signal is 1/M times the frequency of the initial signal, wherein M is a positive integer value and depends on a target bandwidth.

In certain embodiments, the second stage filter compares an amplitude of a waveform of the first filtered signal with an amplitude threshold. The second stage filter determines that the amplitude being larger than the amplitude threshold has the mirror image interference component in the first filtered signal. The second stage filter performs the second stage filtering operation on the first filtered signal to filter the mirror image interference component from the first filtered signal such that the amplitude of the first filtered signal is reduced to be smaller than the amplitude threshold.

In certain embodiments, the second stage filter samples one of a plurality of frequencies in the first filtered signal as a sampled frequency. When the second stage filter determines that an amplitude of a waveform of the first filtered signal at the sampled frequency is larger than an amplitude threshold, the second stage filter performs the second stage filtering operation on the amplitude of the waveform of the first filtered signal at the sampled frequency.

In certain embodiments, the second stage filter samples one of a plurality of frequencies in the first filtered signal as a sampled frequency. When the second stage filter determines that an amplitude of a waveform of the first filtered signal at the sampled frequency is larger than an amplitude threshold, the second stage filter determines a frequency sampled range according to the sampled frequency. Then, the second stage filter performs the second stage filtering operation on the waveform of the first filtered signal that falls within the frequency sampled range.

In certain embodiments, the second stage filter samples some of a plurality of frequencies of the first filtered signal as a plurality of sampled frequencies. When the second stage filter determines that an amplitude of a waveform of the first filtered signal at any one of the plurality of sampled frequencies is larger than an amplitude threshold, the second stage filter performs the second stage filtering operation on the amplitude of the waveform of the first filtered signal that is larger than the amplitude threshold at the one of the plurality of sampled frequencies.

In certain embodiments, the plurality of sampled frequencies sampled by the second stage filter are separated from each other by a predetermined frequency.

In certain embodiments, the second stage filter samples some of a plurality of frequencies of the first filtered signal as a plurality of sampled frequencies. When the second stage filter determines that an amplitude of a waveform of the first filtered signal at any one of the plurality of sampled frequencies is larger than an amplitude threshold, the second stage filter determines a frequency sampled range of the one of the plurality of sampled frequencies. Then, the second stage filter performs the second stage filtering operation on the waveform of the first filtered signal that falls within the frequency sampled range.

In certain embodiments, the plurality of sampled frequencies sampled by the second stage filter are separated from each other by a predetermined frequency.

As described above, the present disclosure provides the two-stage filter. The two-stage filter of the present disclosure performs the filtering operations on the initial signal to adjust the frequency of the initial signal to the target frequency. For example, the two-stage filter of the present disclosure reduces the upper limit frequency of the initial signal to the low target frequency. After the waveforms are additionally generated in the first filtered signal during the first stage filtering operation due to the mirror image interference, the second stage filter of the two-stage filter of the present disclosure performs the second filtering operation on the waveforms of the first filtered signal from the first stage filter. As a result, the waveforms caused by the mirror image interference are filtered out of the first filtered signal by the two-stage filter of the present disclosure. Therefore, the two-stage filter of the present disclosure can finally output the second filtered signal as desired.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
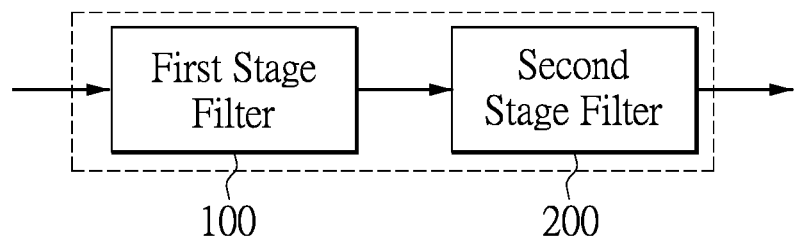
FIG. 1 is a block diagram of a two-stage filter according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
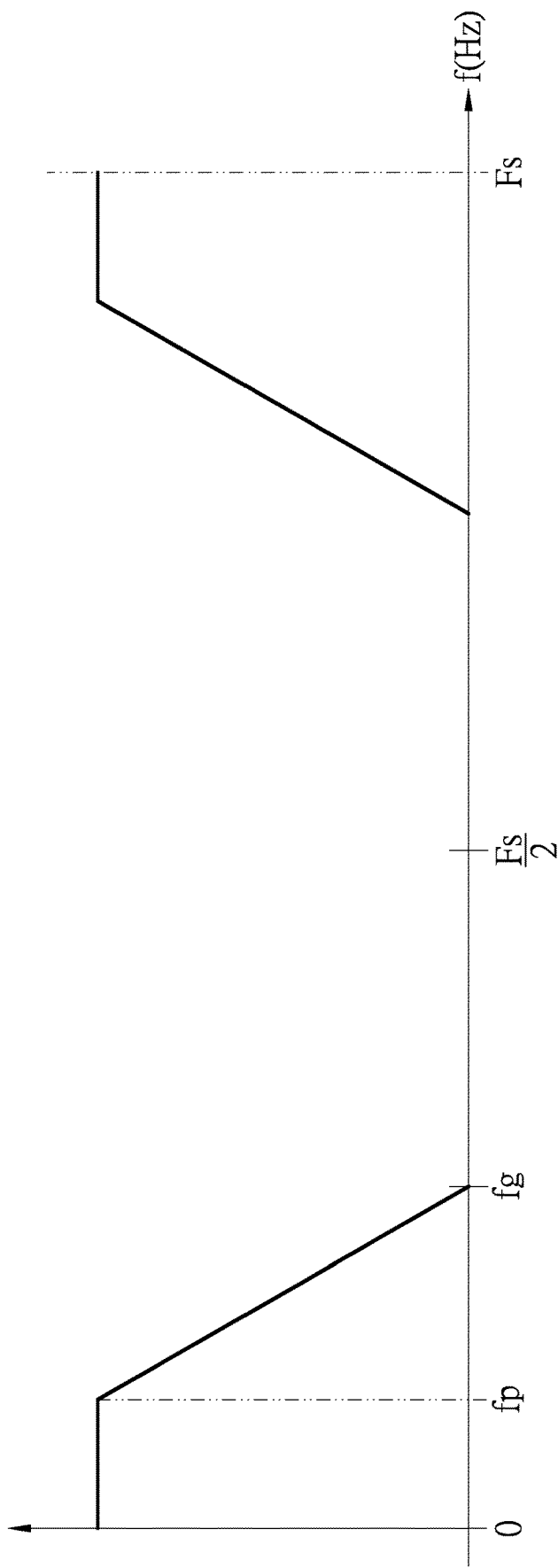
FIG. 2 is a waveform diagram of an initial signal received by a first stage filter of the two-stage filter according to the embodiment of the present disclosure.
Figure 3:
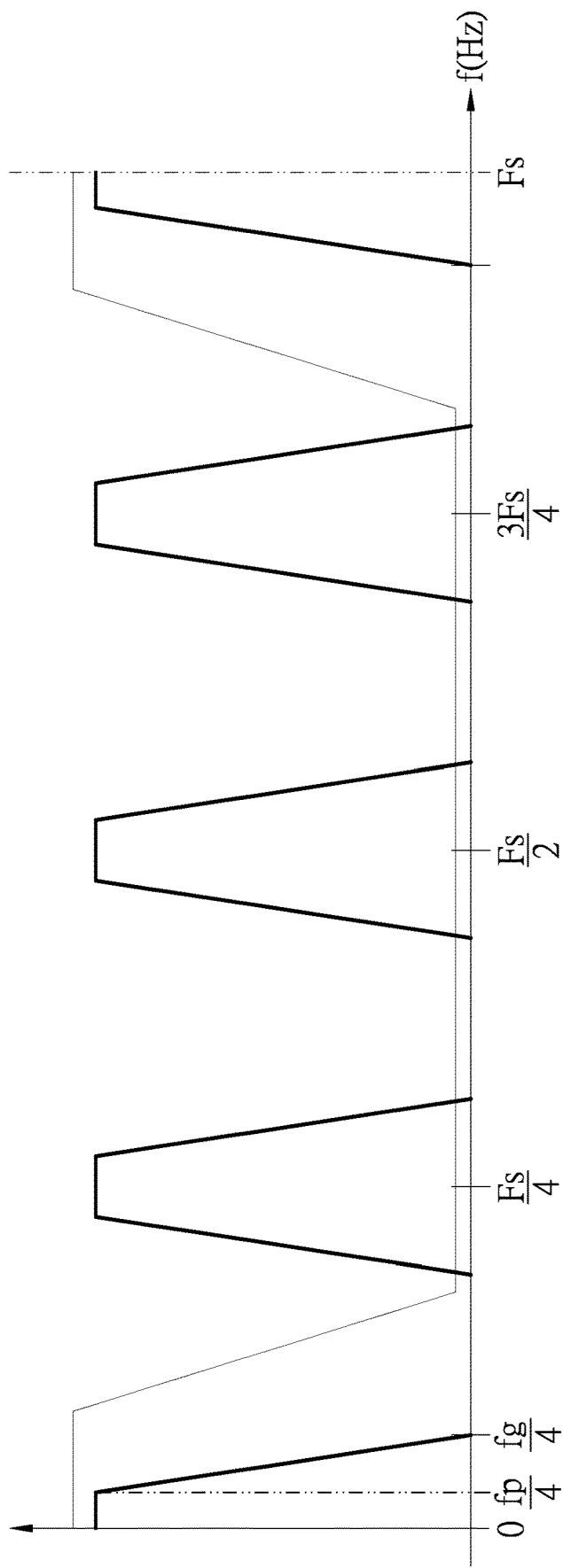
FIG. 3 is a waveform diagram of a first filtered signal that is formed from the initial signal being filtered by the first stage filter of the two-stage filter according to the embodiment of the present disclosure.
Figure 5:
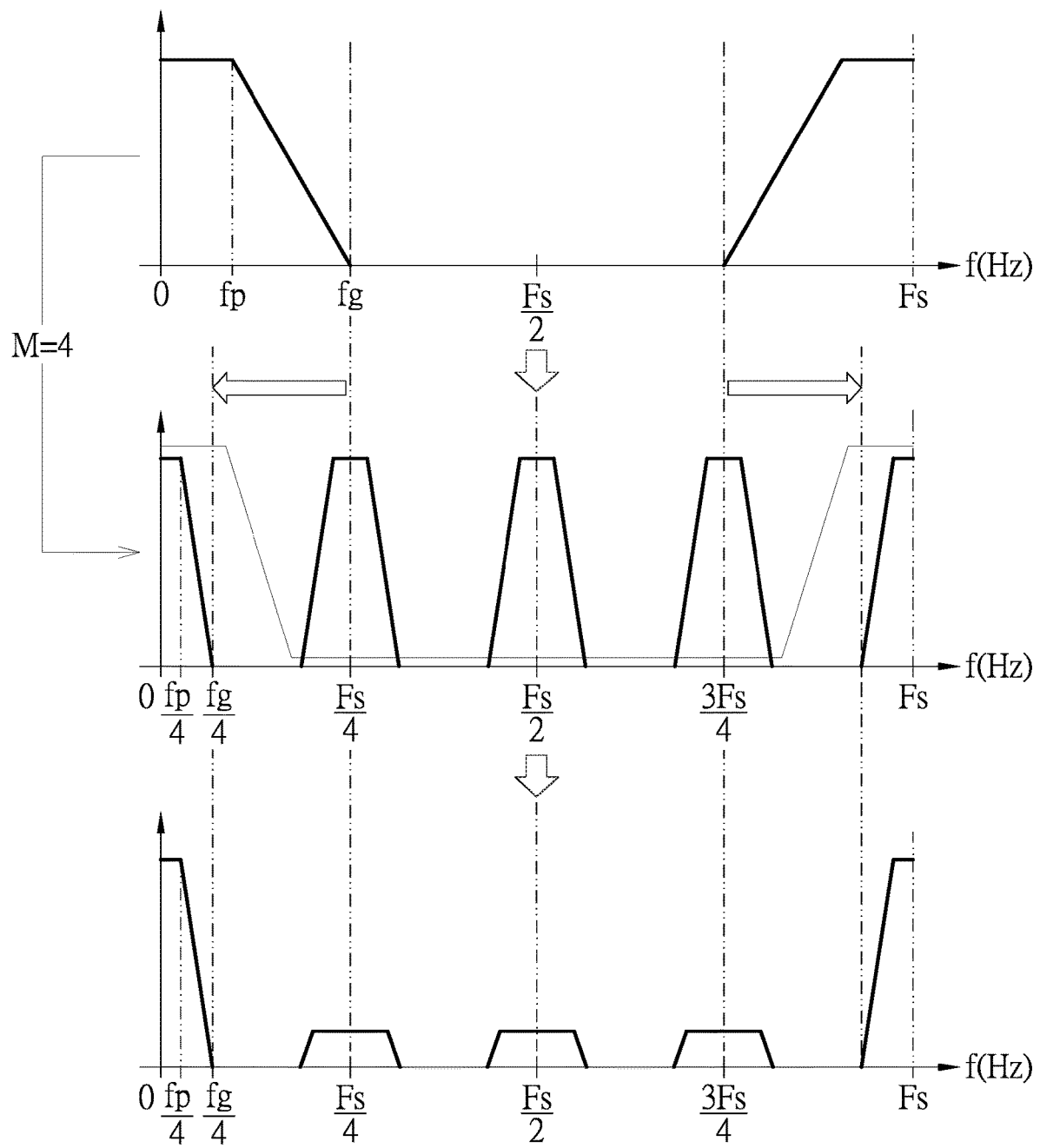
FIG. 5 is a waveform diagram of the initial signal, the first filtered signal and the second filtered signal that are outputted by the two-stage filter according to the embodiment of the present disclosure.

Reference is made to FIGS. 1 to 3, in which FIG. 1 is a block diagram of a two-stage filter according to an embodiment of the present disclosure, FIG. 2 is a waveform diagram of an initial signal received by a first stage filter of the two-stage filter according to the embodiment of the present disclosure, FIG. 3 is a waveform diagram of a first filtered signal that is formed from the initial signal being filtered by the first stage filter of the two-stage filter according to the embodiment of the present disclosure, and FIG. 5 is a waveform diagram of the initial signal, the first filtered signal and the second filtered signal that are outputted by the two-stage filter according to the embodiment of the present disclosure.

As shown in FIG. 1, the two-stage filter of the embodiment of the present disclosure includes a first stage filter 100 and a second stage filter 200. The first stage filter 100 is connected to the second stage filter 200.

The first stage filter 100 may receive a signal from an external circuit connected thereto. For convenience of description, the signal that is received from the external circuit by the first-stage filter 100 is described as an initial signal on which no operation has been performed by the two-stage filter of the present disclosure.

The first stage filter 100 performs a first stage filtering operation on the initial signal to adjust a frequency of the initial signal to output a first filtered signal.

In the embodiment, the first stage filter 100 may be a low-pass filter. The first stage filtering operation that is performed on the initial signal by the first stage filter may be a low-pass filtering operation. In the low-pass filtering operation, the first stage filter 100 reduces an upper limit frequency of the initial signal to a target frequency such that an initial bandwidth of a waveform of the initial signal is reduced to a target bandwidth.

In detail, the first stage filter 100 may determine the target frequency of the upper limit frequency of the initial signal according to the target bandwidth. The first stage filter 100 may set the target frequency of the upper limit frequency of the waveform of the initial signal to be 1/M times the upper limit frequency of the waveform of the initial signal, wherein M is a positive integer value and may depend on the target bandwidth.

For example, as shown in FIG. 5, if the target frequency is set to be ¼ (M=4) times the frequency of the waveform of the initial signal, the first stage filter 100 reduces the frequency of the waveform of the initial signal to be ¼ times the frequency of the waveform of the initial signal. Under this condition, a frequency fp of the waveform of the initial signal as shown in FIG. 2 is reduced to be ¼ times the frequency fp of the waveform of the initial signal as shown in FIG. 3, but the present disclosure is not limited thereto. In particular, an upper limit frequency fg of the waveform of the initial signal as shown in FIG. 2 is reduced to be ¼ times the upper limit frequency fg of the waveform of the initial signal as shown in FIG. 3. In practice, M may be adjusted according to actual requirements, and the present disclosure is not limited thereto.

Figure 4:
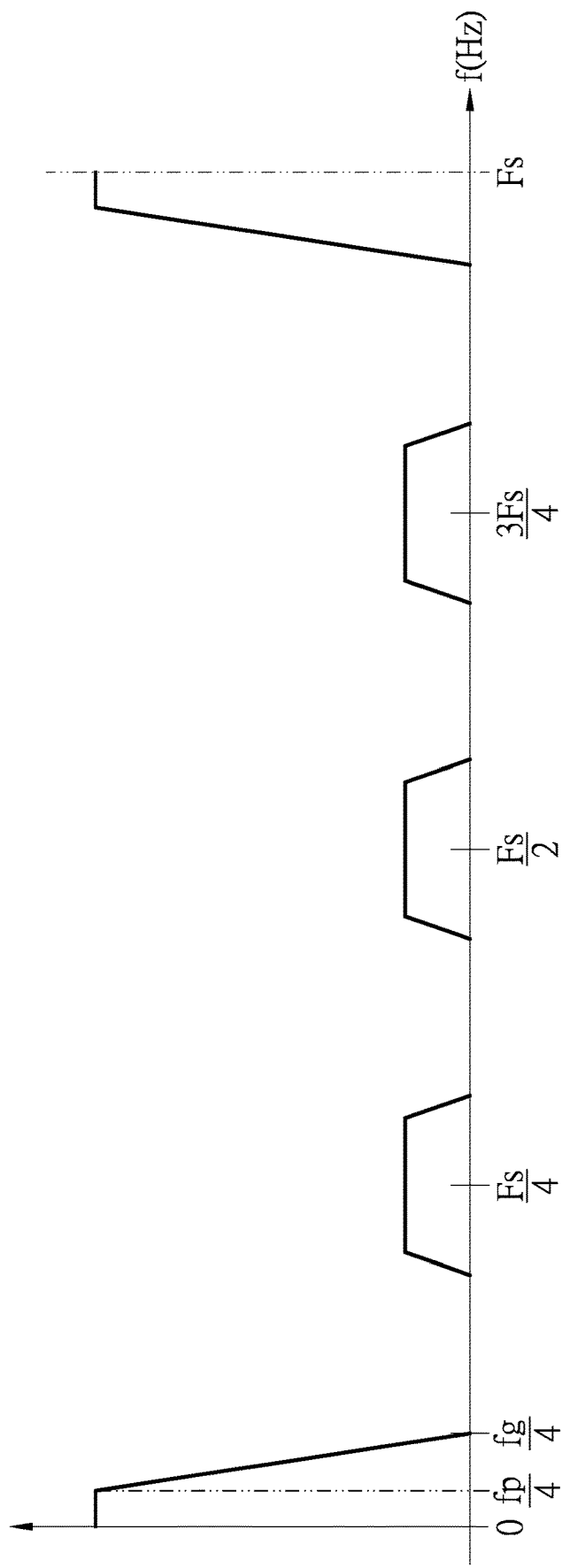
FIG. 4 is a waveform diagram of a second filtered signal formed from the first filtered signal in which most of a mirror image interference component is filtered out by a second first stage filter of the two-stage filter according to the embodiment of the present disclosure.

Reference is made to FIGS. 1 to 5, in which FIG. 4 is a waveform diagram of a second filtered signal formed from the first filtered signal in which most of a mirror image interference component is filtered out by a second first stage filter of the two-stage filter according to the embodiment of the present disclosure.

It is worth noting that, the first stage filtering operation performed on the initial signal by the first stage filter 100 is affected by mirror image interference. As a result, the mirror image interference component is additionally generated in the first filtered signal at one or more frequencies. For example, waveforms are additionally generated (described as mirror image waveforms herein) in the first filtered signal due to the mirror image interference.

For example, as shown in FIG. 3, in the first filtered signal that is formed from the initial signal on which the first stage filtering operation is performed by the first stage filter 100, three mirror image waveforms are additionally generated due to the mirror image interference. The three mirror image waveforms fall within three frequency ranges respectively. For example, as shown in FIG. 3, center frequencies of the three mirror image waveforms are respectively Fs/4, Fs/2 and 3Fs/4. It should be understood that the number, the amplitudes, the frequencies and the bandwidths of the mirror image waveforms that are generated due to the mirror image interference may depend on performance of the first stage filter 100, steps of the first stage filtering operation performed on the initial signal, and other factors.

The mirror image interference component is additionally generated in the first filtered signal outputted by the first stage filter 100. The mirror image interference component must be completely or partially filtered out of the first filtered signal, thereby preventing subsequent applications of the first filtered signal from being affected by the mirror image interference component.

Therefore, in the two-stage filter of the present disclosure, an output terminal of the first stage filter 100 is connected to an input terminal of the second stage filter 200. The first stage filter 100 outputs the first filtered signal to the second stage filter 200. Then, the second stage filter 200 performs the second stage filtering operation on the first filtered signal to filter the first filtered signal.

In the second stage filtering operation, the second stage filter 200 may compare the amplitude of the waveform of the first filtered signal from the first stage filter 100 with an amplitude threshold. The second stage filter 200 determines that the amplitude of the first filtered signal that is larger than the amplitude threshold has the mirror image interference component. The second stage filter 200 performs the second stage filtering operation on the mirror image interference component of the first filtered signal to output the second filtered signal.

In the second stage filtering operation, the second stage filter 200 may sample one of a plurality of frequencies in the first filtered signal as a sampled frequency. The second stage filter 200 may select one of the plurality of frequencies, each of which is larger than an upper limit frequency of the waveform of the first filtered signal and falls within a frequency range, as the sampled frequency. For example, as shown in FIG. 3, the second stage filter 200 may select one of a plurality of frequencies falling within a frequency range of the upper limit frequency "fg/4" of one of the plurality of waveforms of the first filtered signal to an upper limit frequency of a next one of the plurality of waveforms of the first filtered signal as the sampled frequency.

When the second stage filter 200 determines that the amplitude of the waveform of the first filtered signal at the sampled frequency is larger than the amplitude threshold, the second stage filter 200 determines that the waveform of the first filtered signal at the sampled frequency is generated due to the mirror image interference component. The waveform that is generated due to the mirror image interference component is described as a mirror image amplitude herein. The second stage filter 200 performs the second stage filtering operation on the mirror image amplitude of the waveform of the first filtered signal at the sampled frequency. As a result, the mirror image amplitude of the waveform of the first filtered signal at the sampled frequency is reduced to be smaller than the amplitude threshold.

For example, the first filtered signal that is received from the first stage filter 100 by the second stage filter 200 has the three mirror image waveforms as shown in FIG. 3. The second stage filter 200 samples some of a plurality of frequencies of the first filtered signal such as, but not limited to the center frequencies "Fs/4", "Fs/2" and "3Fs/4" as shown in FIG. 3, wherein Fs represents an upper limit frequency of a signal processing range. The second stage filter 200 performs the second stage filtering operation on the three mirror image waveforms to reduce the amplitude of each of the three mirror image waveforms to be smaller than the amplitude threshold as shown in FIGS. 4 and 5, but the present disclosure is not limited thereto.

The entire mirror image waveform may be generated at a plurality of frequencies instead of a single frequency, and the sampled frequency may not be the center frequency of the mirror image waveform as described above. Therefore, when the second stage filter 200 determines that the amplitude of the waveform of the first filtered signal at the sampled frequency is larger than the amplitude threshold, the second stage filter 200 may determine a frequency sampled range according to the sampled frequency. The second stage filter 200 may determine and adjust the frequency sampled range according to a value of the sampled frequency, the amplitude of the waveform of the first filtered signal, a difference between the amplitude of the waveform of the first filtered signal and the amplitude threshold, and other conditions. The second stage filter 200 may perform the second stage filtering operation on the entire waveform of the first filtered signal that falls within the frequency sampled range to reduce the amplitude and other values on the entire mirror image waveform of the first filtered signal to be smaller than the amplitude threshold.

As described above, the second stage filter 200 only samples one sampled frequency, but the present disclosure is not limited thereto. In practice, the second stage filter 200 may sample some of a plurality of frequencies of the first filtered signal as a plurality of sampled frequencies.

The plurality of sampled frequencies may be separated from each other by a predetermined frequency. A difference between a first one of the plurality of sampled frequencies and the upper limit frequency of the waveform of the first filtered signal (such as the upper limit frequency "fg/4" as shown in FIG. 4) may be a predetermined starting sampled frequency difference, but the present disclosure is not limited thereto.

The second stage filter 200 may compare each of the plurality of sampled frequencies with the amplitude threshold. When the second stage filter 200 determines that the amplitude of the waveform of the first filtered signal at any one of the plurality of sampled frequencies is larger than the amplitude threshold, the second stage filter 200 performs the second stage filtering operation on the amplitude of the waveform of the first filtered signal at the one of the plurality of sampled frequencies to be smaller than the amplitude threshold.

Alternatively, when the second stage filter 200 determines that the amplitude of the waveform of the first filtered signal at any one of the plurality of sampled frequencies is larger than the amplitude threshold, the second stage filter 200 may determine the frequency sampled range. The second stage filter 200 may perform the second stage filtering operation on the entire waveform of the first filtered signal that falls within the frequency sampled range to reduce the amplitude and other values on the entire waveform of the first filtered signal to be smaller than the amplitude threshold.

In conclusion, the present disclosure provides the two-stage filter. The two-stage filter of the present disclosure performs the filtering operations on the initial signal to adjust the frequency of the initial signal to the target frequency. For example, the two-stage filter of the present disclosure reduces the upper limit frequency of the initial signal to the low target frequency. After the waveforms are additionally generated in the first filtered signal during the first stage filtering operation due to the mirror image interference, the second stage filter of the two-stage filter of the present disclosure performs the second filtering operation on the waveforms of the first filtered signal from the first stage filter. As a result, the waveforms caused by the mirror image interference are filtered out of the first filtered signal by the two-stage filter of the present disclosure. Therefore, the two-stage filter of the present disclosure can finally output the second filtered signal as desired.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-stage filter, comprising:
   a first stage filter configured to perform a first stage filtering operation on an initial signal to adjust a frequency of the initial signal to output a first filtered signal; and
   a second stage filter connected to the first stage filter, and configured to perform a second stage filtering operation on the first filtered signal for filtering a mirror image interference component that is additionally generated from the first filtered signal during the first stage filtering operation, to output a second filtered signal.

2. The two-stage filter according to claim 1, wherein the first stage filter determines a frequency of the first filtered signal according to a target bandwidth.

3. The two-stage filter according to claim 1, wherein the first stage filtering operation that is performed on the initial signal by the first stage filter is a low-pass filtering operation, and the first stage filter reduces an upper limit frequency of the initial signal to a target frequency such that an initial bandwidth of a waveform of the initial signal is reduced to a target bandwidth in the low-pass filtering operation.

4. The two-stage filter according to claim 1, wherein a frequency of the first filtered signal is 1/M times the frequency of the initial signal, wherein M is a positive integer value and depends on a target bandwidth.

5. The two-stage filter according to claim 1, wherein the second stage filter compares an amplitude of a waveform of the first filtered signal with an amplitude threshold, the second stage filter determines that the amplitude being larger than the amplitude threshold has the mirror image interference component in the first filtered signal, and the second stage filter performs the second stage filtering operation on the first filtered signal to filter the mirror image interference component from the first filtered signal such that the amplitude of the first filtered signal is reduced to be smaller than the amplitude threshold.

6. The two-stage filter according to claim 1, wherein the second stage filter samples one of a plurality of frequencies in the first filtered signal as a sampled frequency, and when the second stage filter determines that an amplitude of a waveform of the first filtered signal at the sampled frequency is larger than an amplitude threshold, the second stage filter performs the second stage filtering operation on the amplitude of the waveform of the first filtered signal at the sampled frequency.

7. The two-stage filter according to claim 1, wherein the second stage filter samples one of a plurality of frequencies in the first filtered signal as a sampled frequency;
   wherein, when the second stage filter determines that an amplitude of a waveform of the first filtered signal at the sampled frequency is larger than an amplitude threshold, the second stage filter determines a frequency sampled range according to the sampled frequency, and the second stage filter performs the second stage filtering operation on the waveform of the first filtered signal that falls within the frequency sampled range.

8. The two-stage filter according to claim 1, wherein the second stage filter samples some of a plurality of frequencies of the first filtered signal as a plurality of sampled frequencies, and when the second stage filter determines that an amplitude of a waveform of the first filtered signal at any one of the plurality of sampled frequencies is larger than an amplitude threshold, the second stage filter performs the second stage filtering operation on the amplitude of the waveform of the first filtered signal that is larger than the amplitude threshold at the one of the plurality of sampled frequencies.

9. The two-stage filter according to claim 8, wherein the plurality of sampled frequencies sampled by the second stage filter are separated from each other by a predetermined frequency.

10. The two-stage filter according to claim 1, wherein the second stage filter samples some of a plurality of frequencies of the first filtered signal as a plurality of sampled frequencies;
    wherein, when the second stage filter determines that an amplitude of a waveform of the first filtered signal at any one of the plurality of sampled frequencies is larger than an amplitude threshold, the second stage filter determines a frequency sampled range of the one of the plurality of sampled frequencies, and the second stage filter performs the second stage filtering operation on the waveform of the first filtered signal that falls within the frequency sampled range.

11. The two-stage filter according to claim 10, wherein the plurality of sampled frequencies sampled by the second stage filter are separated from each other by a predetermined frequency.

* * * * *